(12) United States Patent
Sirtori et al.

(10) Patent No.: US 6,988,114 B2
(45) Date of Patent: Jan. 17, 2006

(54) PROCESS AND SYSTEM FOR COMPRESSING AND DECOMPRESSING DIGITAL INFORMATION AND COMPUTER PROGRAM PRODUCT THEREFORE

(75) Inventors: Daniele Sirtori, Milan (IT); Danilo Pau, Sesto San Giovanni (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 578 days.

(21) Appl. No.: 10/044,302

(22) Filed: Jan. 10, 2002

(65) Prior Publication Data

US 2002/0152247 A1 Oct. 17, 2002

(30) Foreign Application Priority Data

Jan. 12, 2001 (EP) ................................. 01830014

(51) Int. Cl.
*G06F 5/00* (2006.01)
(52) U.S. Cl. ...................................... 708/203; 382/232
(58) Field of Classification Search ................ 708/203; 382/232

See application file for complete search history.

(56) References Cited

U.S. PATENT DOCUMENTS 6,574,368 B1 * 6/2003 Boon et al. ................. 382/232
2001/0000711 A1 * 5/2001 Queiroz et al. ............. 382/264

FOREIGN PATENT DOCUMENTS

| EP | 0 444 839 A2 | 9/1991 |
| EP | 0 523 939 A2 | 1/1993 |
| WO | WO 98/11728 | 3/1998 |

OTHER PUBLICATIONS

Matsumura, S., "Upper Bits Separation Coding of Images Using Vector Quantization," *International Conference on Acoustics, Speech & Signal Processing*, ICASSP, Glasgow, Scotland, May 23-26, 1989, pp. 1751-1754.
Salomon, D., *Data Compression: The Complete Reference*, Springer, New York, 1998, Chapter 3, "Dictionary Methods," pp. 101-162, 357-360.
Zhang, Y. et al., "A Combined Transform Coding (CTC) Scheme for Medical Images," *IEEE Transactions on Medical Imaging 11*(2):196-202,1992.
Bruni, R. et al., "A Novel Adaptive Vector Quantization Method for Memory Reduction in MPEG-2 HDTV Decoders," *IEEE Transactions on Consumer Electronics 44*(3): 537-543, A 1998.

* cited by examiner

*Primary Examiner*—D. H. Malzahn
(74) *Attorney, Agent, or Firm*—Lisa K. Jorgenson; Robert Iannucci; Seed IP Law Group PLLC

(57) ABSTRACT

A process for converting signals in the form of digital data, such as various types of video/audio/data signals for example, between an original format, in which each data item includes a certain number of digits, and a compressed format, in which each data item includes a smaller number of digits. The process includes the operation of associating the data with a configuration including: a first field identifying the number of sub-blocks into which the said certain number of digits are subdivided, a second field that identifies, within the said sub-blocks, respective sections, each one including a given number of digits, and a third field that identifies, for each these sections, one of a plurality of applicable modes (average, compression, transmission "as is", etc.) that can be adopted for converting the digits in the section between the original format and the compressed format.

29 Claims, 11 Drawing Sheets

Figure 1:
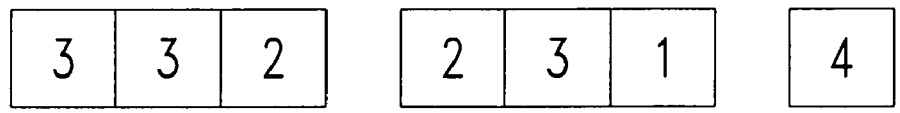

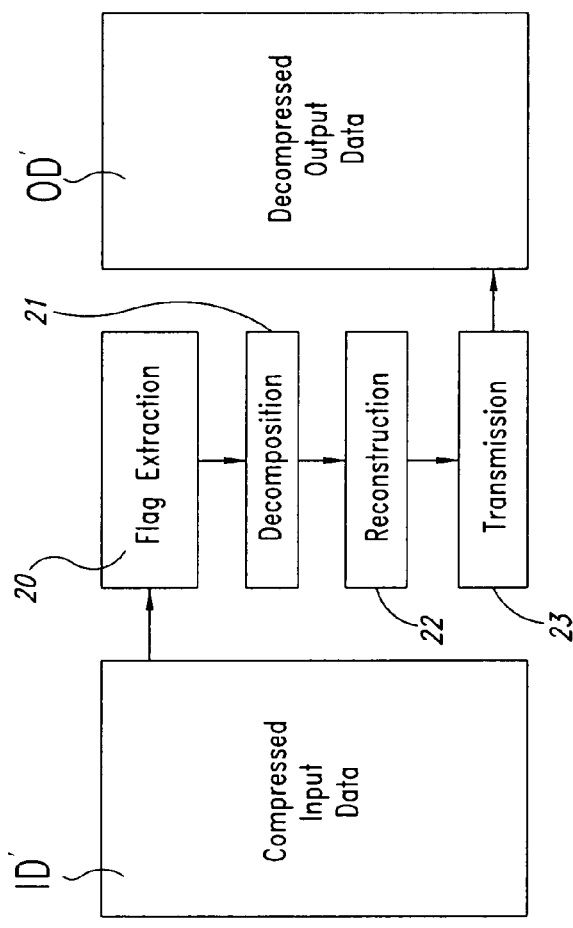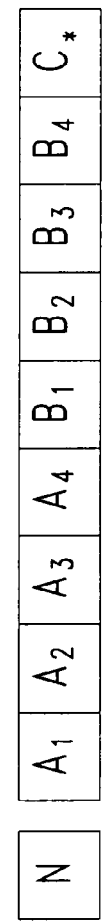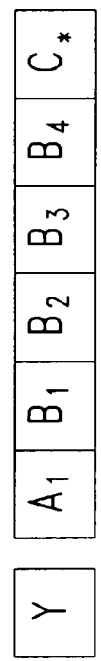
FIG. 17
FIG. 18

FIG. 22

PROCESS AND SYSTEM FOR COMPRESSING AND DECOMPRESSING DIGITAL INFORMATION AND COMPUTER PROGRAM PRODUCT THEREFORE

BACKGROUND OF THE INVENTION

1. Field of the Invention

The present invention refers, in general, to the compression/decompression of digital information.

2. Description of the Related Art

In the description and definition of a system for processing digital information, three different structure categories are always present: those of input/output, those for processing the data and those for storing it.

Clearly, each of these structures is specialized for the carrying out a certain function independently of the others and this directly reflects on how their connections and communications are structured and also how these structures are internally defined.

From the general viewpoint, the common starting point for the definition and description of the system's architecture is the definition of the field of application in which this system is located and used. Once this point is clear, the definition of all of the parameters that characterize the final application can be given, starting from the main element, i.e., the necessary interfaces for data acquisition and transmission.

Following the definition of the input/output interfaces, the definition of the system that deals with processing this data will be given and then the definition of how and where the data storage function is carried out.

Starting from the supposition that the definition of the best system for processing the data is without doubt highly complex, the phase of choosing the storage system, which is also a key point, in the definition of the architecture of a system, becomes the last aspect to be covered. The complexity of the storage system depends on many factors, such as its size, the type of memory (SRAM, DRAM, cache, Flash, FIFO, etc.), the type and speed of access based on the maximum frequency and size of the communications bus and the various clock domains present in the system, the correct partitioning between intermediate and final storage buffers, synchronization buffers and so on, and lastly, the position in the processing chain and all of the other factors that are directly dependent on the application. The critical nature of the part of the system concerned with memory between the data processing part and that handling the effective storage, and taking care of the compression of the data, has already been recognized.

In particular, the need for solutions, that allow digital information to be compressed in a variable manner via a mechanism with very low computational complexity, but still capable of ensuring high quality for the information that is decompressed, is clearly felt.

All of this has the main purpose of pursuing the following objectives:

reduction of the number of accesses required for performing memory read and write operations,
reduction of the amount of data that is transmitted over the communications channels, with a consequent increase in the effective transmission bandwidth available in the system,
predictable reduction in the amount of memory required,
possibility of dynamically varying the limits of the compression factor while the application is in execution,
attainment of high speed in compression and decompression operations, especially due to reduced complexity,
minimization of loss of quality of the digital information,
possibility of avoiding the negative effects related to the recursive loss of initial quality,
possibility of realizing solutions that are essentially invariant with respect to the quantity, location and content of the information to be compressed.

BRIEF SUMMARY OF THE INVENTION

An embodiment of the present invention realizes a solution capable of achieving the above-outlined objects.

An embodiment of the present invention refers to a process that employs data conversion between an original format and a compressed format independently of the direction in which the conversion is realized.

Embodiments of the invention also refer to the relative system and corresponding computer program product.

The process allows significant benefits to be achieved, including reductions in the quantity of transmitted data (with relative increase in available bandwidth), lower number of conflicts per access to the communications bus (given that a larger amount of data is simultaneously loaded and unloaded) and a reduction in the final amount of memory required for saving the intermediate and/or final data.

All of this while having access to a dynamic compression factor limited above and below by two predetermined finite percentage coefficients.

The process can, for example, be applied to contexts where cache memory is employed, improving performance thanks to the greater number of hits and a reduction in the misses. All with particular attention given to possible real-time applications, given the parallelism expressed by the compression/decompression technique, and general purpose applications based on standard mass memory. All with a predictable reduction in the final amount of memory used.

Thanks to the reduced level of switching that can be attained, the process is generally applicable in all contexts where a reduction in transmitted data is fundamental, including applications based on digital information with high internal correlation and/or applications where low energy consumption is required (wireless and/or mobile phones for example).

The process appears as potentially "lossy", that is with the possibility in certain cases—of having a limited and controlled loss of information. As is known, this fact is not in itself an impediment to successful utilization, especially in certain sectors such as image processing where a controlled loss of information is acceptable thanks to the fact that the human eye is insensible to certain variations, as stated in the well known HVS theory (acronym for the Human Visual System).

A fundamental element of the process is the so-called "configuration". As has already been stated, it is possible that certain configurations, at the end of the compression and decompression phases, introduce a limited loss of information on the signals handled (of an image for example). It is necessary to bear this factor in mind with regards to where a system in accordance with the invention should be located within the processing chain. For example, if applied upstream of the entire processing chain, a system in accordance with the invention is likely to influence the quality of the results produced by the processing stages that follow. On the other hand, if applied downstream of the entire processing chain, that is before final storage, the possible, limited loss of information is likely to only influence the size of final mass memory requirements and not bandwidth or the general reduction of bus communications.

It should be noted that a possible contained loss of information introduced during the first compression activity is not subsequently introduced in successive applications, thereby resulting invariant over time. Replication of the compression and decompression process in any intermediate phase of an input, data handling and processing, writing, reading and output chain is therefore justified.

In any case, the application possibilities of the solution according to the invention embrace all possible digital data formats (video, audio, various kinds of data etc.) that are suitable for forming basic data for input to a system according to the invention.,

BRIEF DESCRIPTION OF THE SEVERAL VIEWS OF THE DRAWING(S)

Figure 2:
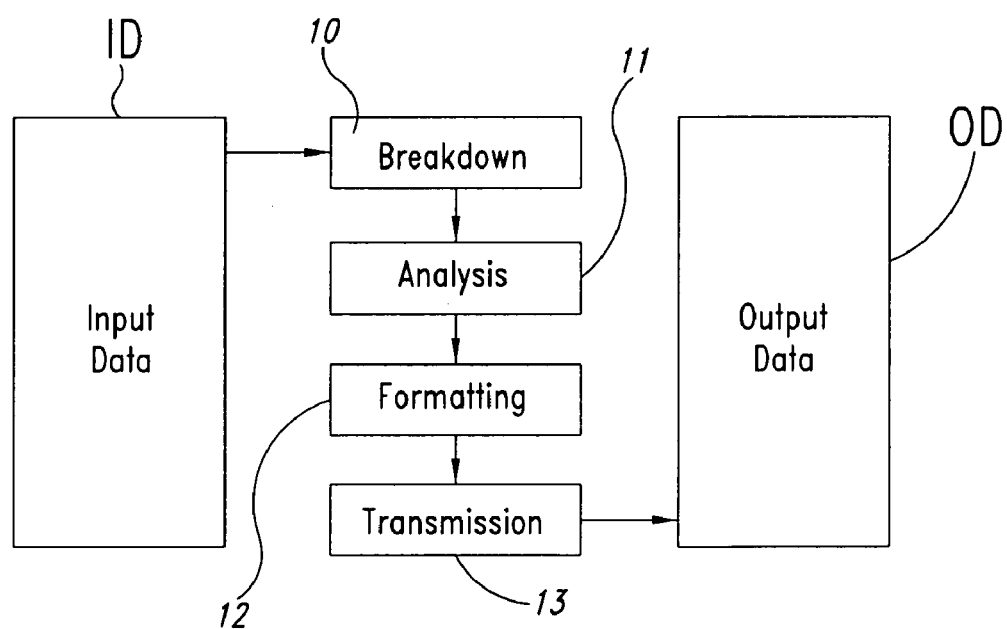
Figure 8:
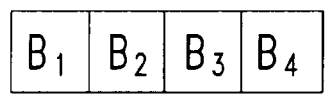
Figure 9:
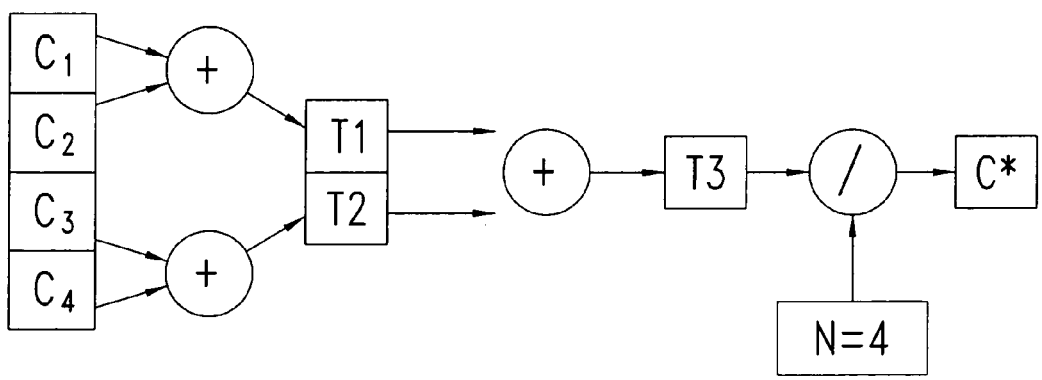
Figures 10, 11, 12:
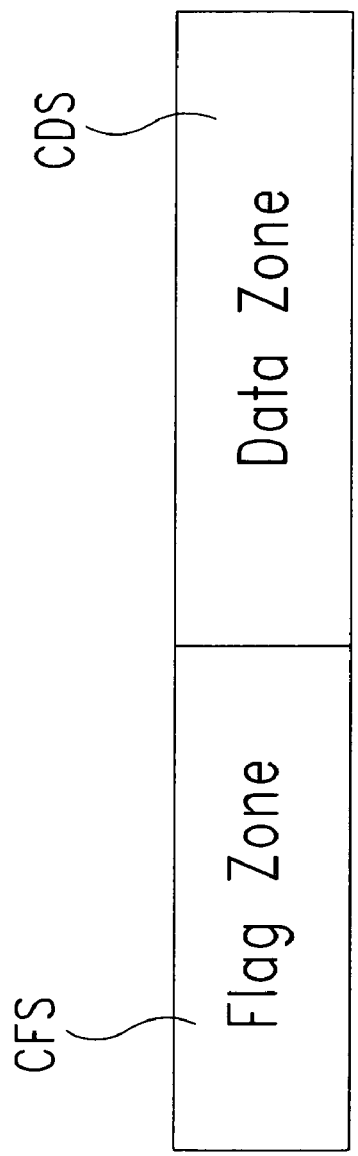
Figure 19:
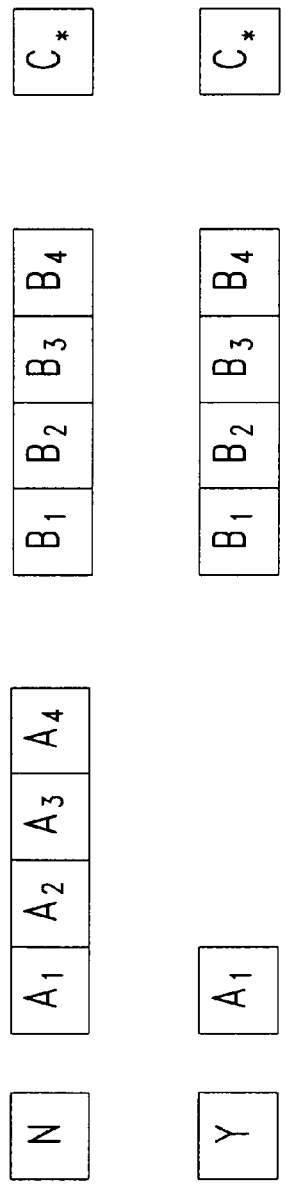
Figure 20:
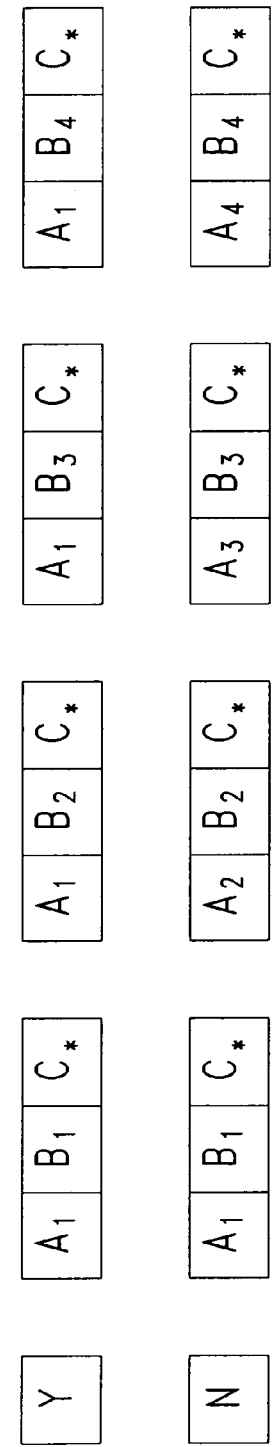
Figure 21:
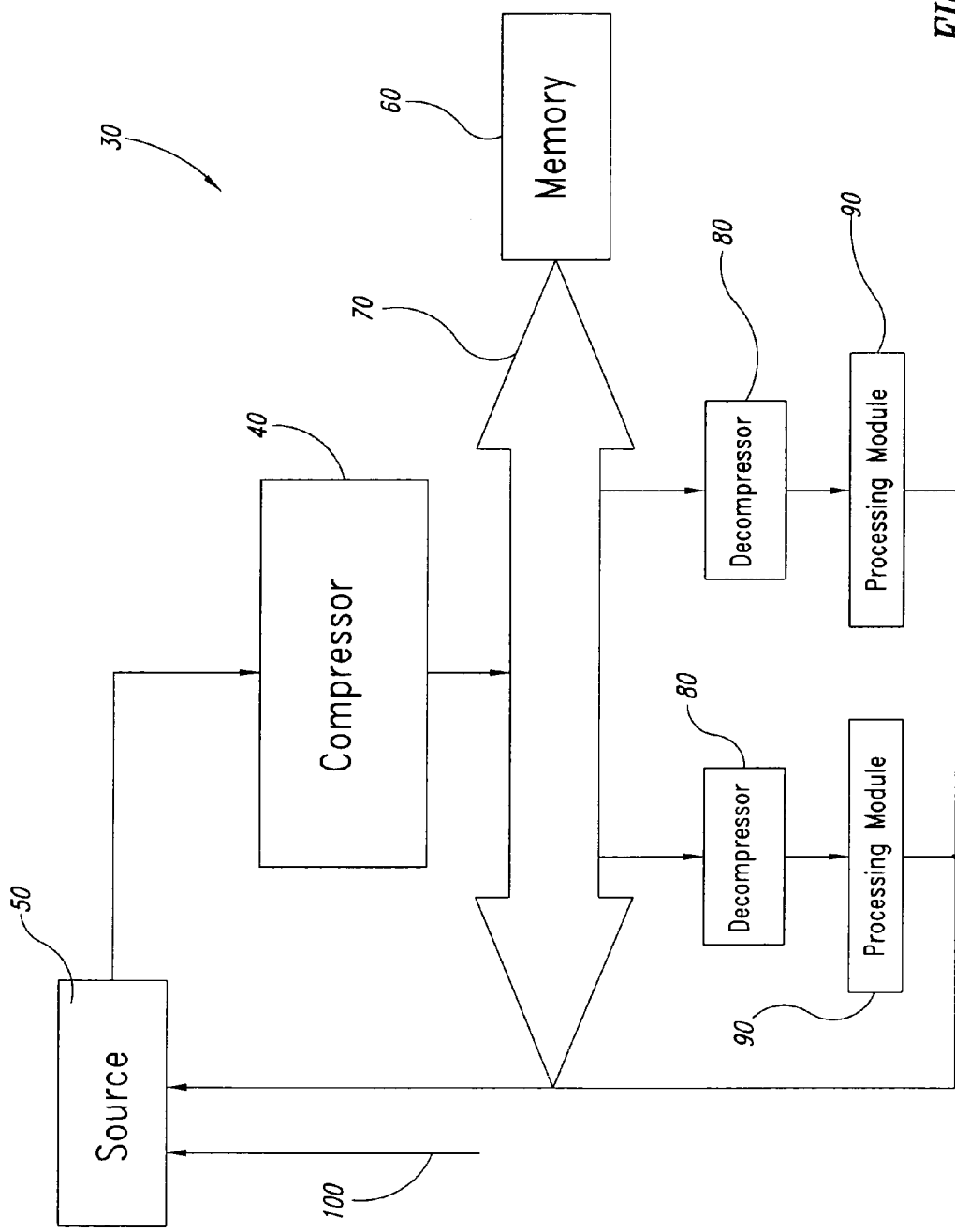

Further characteristics and advantages of the invention will become clear from the description that follows, which is given purely as a non limitative example with reference to the attached drawings, where:

FIG. 1 illustrates a data configuration example that can be used within the scope of the present invention, FIG. 2 illustrates the general sequence of the compression process flow within the scope of the present invention, FIG. 3 schematically illustrates the organization of data that is suitable for being input to a system in accordance with the invention, FIGS. 4 to 10 schematically illustrate the sequence of the subsequent processing phases according to the invention and used by the compression function, FIGS. 11 and 12 respectively illustrate different options of representing the data in compressed format, depending on whether execution of the compression operation was unsuccessful or successful, FIGS. 13 to 16 illustrate various examples of possible outcomes of data compression, with particular attention to the relative compression gain factors that can be achieved, FIG. 17 is a schematic diagram of one decompression process according to the invention, FIGS. 18 to 20 schematically illustrate the sequence of the subsequent processing phases according to the invention and used by the decompression function, FIG. 21 summarizes the general structure of a system in accordance with the invention, and FIG. 22, including the three overlays respectively indicated as a), b) and c), illustrates the application of the solution in accordance with the invention to the treatment of video signals.

DETAILED DESCRIPTION OF THE INVENTION

As has already been stated, the solution in accordance with the invention refers to the compression/decompression of digital data.

The common element of both of these phases is denominated the "configuration": an example of this configuration is represented in FIG. 1.

When performing the compression function, the purpose of the configuration is to describe the manner in which the initial (source) digital information must be broken down and then how these subdivisions must be processed.

When performing the decompression function, the purpose of the configuration is to describe how compressed data is to be identified and subjected to decompression: in practice, how the original information must be reconstructed.

In the remainder of this description, purely by way of example, reference will be made to the fundamental unit of digital information in the Image Processing sector, considering the size of each data item as one byte (range [0, 255]).

It should be underlined that this is only an example referred to a preferential field of application of the invention; this reference should not therefore be interpreted in any manner as a limitation to the extent of the invention's field of application.

The configurations used are composed of N [a]+N [b]+1 values, where N indicates the number of parts that the data of the image is to broken down into and 1 data item for indicating the number of these data elements that must be regrouped.

The parameters "a" and "b" have, in turn, an additional significance.

Parameter "a" serves to identify the size of each subpart defined by the breakdown, while parameter "b" identifies the processing mode for these sub-parts. It should be remembered that these modes process data items independently of each other.

The sum of the N [a] must be equal to the maximum size of the data unit that the compression process is based on (in case of the examples on which this description is based—in a non limitative manner—this is the byte).

Reference can be made to the following Table I for the modes identified by N[b]: the relevance of these modes will become evident during the subsequent description of the source data analysis phase.

TABLE I

| MODE | MEANING |
|------|---------|
| 1 | Average |
| 2 | Compression |
| 3 | Original |
| 4 | Fixed |
| ... | <open> |

For the first example illustrating a solution in accordance with the invention, the following configuration will be considered:

N=3

"a":

N[1°]=3

N[2°]=3

N[3°]=2

"b":

N [1°]=Compression=>2

N [2°]=Original=>3

N [3°]=Average=>1 grouping=4 which precisely corresponds to the configuration shown in FIG. 1.

As can be seen, each original digital data item is comprised of 4 bytes, that is, a certain number of digits (32 binary digits in the example shown) and must be compressed into a compressed format where each data item is comprised of fewer digits.

Adoption of the aforesaid configuration signifies that each original data item be subdivided into four groupings or sub-blocks (precisely bytes #1, #2, #3 and #4 of FIG. 3), this number of sub-blocks being indicated by the first field—which, in reality, appears as the last in the order shown for the configuration adopted in FIG. 1 and in the above Table I.

Another field of the configuration ("a") identifies, at the level of the said sub-blocks, respective sections each including a given number of digits (three, three and two in the configuration example that is referred to).

A further field of the configuration identifies, for the said sections, one of a range of modes adopted for the conversion of the digits included in the said section; that is, always with reference to the configuration example illustrated herein: compression (code 2 in Table I) for the first section, reproduction in original format (code 3 in Table I) for the second section and, finally, average (code 1 in Table I) for the third section.

In general, an unequivocal optimal value does not exist for each subgroup that has been defined within the configuration, but only limits within which it is possible to maneuver.

As has been stated, the sum of the N[a] should not exceed the size of the process base unit. Instead, the N[b] modes do not have limits, since they only define the cardinal number of the processing type, while the last data item can arrive up to the maximum size of the information to be compressed.

In the Image Processing field, this value can be the entire field, a frame, a so-called GOP (Group of Picture, with reference to the MPEG standard), or an entire video stream. Essentially, everything depends on the type of input data and/or the end-user's responsibility.

The above-said absence of a fixed value, optimal for all types of source, fundamentally depends on the fact that the solution in accordance with the invention is adaptive with respect to the content of the signal that is processed (of an image in the example that is referred to). In consequence, for any variation in the said input, the parameters destined to be used for achieving the best performance will also vary.

It should be underlined that the values presented in this description are exclusively intended to give an explanation of the solution in accordance with the invention, with specific reference to compression and decompression operations. No specific mention is therefore made of the real content of the input data.

Compression

The diagram in FIG. 2, using a functional block layout, illustrates the sequence of operations that permit the passage from input data ID (in original, uncompressed format) to output data OD (in compressed format) via a sequence of successive processing phases, identified overall as:

breakdown 10,
analysis 11,
formatting 12, and
transmission 13.

The operational modes of the said phases or operations will be better illustrated in the following.

As a general consideration, it may be observed that the compression is based on reiteration of the subdivision process of the source into a constant number of parts that thus constitute the basic elements of the entire process and from which the relative compressed representation is created.

It is important to note that these subdivisions are treated independently of each other so as to achieve the threefold objective of:

simplifying the compression and decompression process by being able to handle each object separately without any additional data, limiting the number and size of internal buffers for possible storage of this information, limiting the transfer of errors that might be introduced.

With regards to the first aspect, it should be noted that if the compression of each block, derived from the subdivision of the image, depended on the compression of the previous block, a dependence would be created that would make it necessary to also transmit the optimal configuration for each block. In the case of a "gap" in compressed information, it would no longer be possible to reconstruct data from that point on, or effect parallel decompression of compressed data.

It can therefore be affirmed that all of the information necessary for decompressing the compressed data coexists within the compressed data. Each compressed block is structured and composed of different information with respect to the others, while the configuration with which they were processed is the same.

In this way it is possible to simplify the decompression engine because it only needs to be informed once about the "configuration" used, thus avoiding the need to transmit it with each data block. It is thus possible to run multiple decompression operations in parallel and also reduce the amount of data that must be transmitted.

The adaptability of the compression process is at the root of this verity. This can be deduced from the possibility of being able to modify the compression parameters at runtime and hence those of decompression (and thus the configuration).

The minimum advised time frequency for effecting changes to the said parameters could be set for each image. This is because the compressor can add a header to each synchronization signal at the beginning of a new image, indicating the type of processing that the image is destined to undergo (in practice, it is sufficient to save the actual configuration in the header).

The decompressor, instead, can read the compressed image header to reprogram itself so that it can correctly decompress and reconstruct the source image. The need of a header for each image derives from the fact that since there are two processes activated at different times and for different data; these must have a means of mutually synchronizing themselves.

As further exemplification of compression criteria that are suitable for usage within the scope of the invention, it is always assumed that an input signal (image signal) being dealt with is subdivided into portions according to the previously described criteria, i.e., portion composed of four bytes (or pixels) at a time. Thus, the basic unit of data is composed of 32 bits.

Proceeding to the breakdown phase 10, it will be noted that the method by which the bytes must be subdivided and broken down derives from the choice of configuration (shown in FIG. 4 for clarity); this method basically implicates the creation of four different data sub-blocks, divided into three different sections, namely:

a "higher" section composed of three bits,
a "middle" section, also composed of three bits, and
a "lower" section composed of the two remaining bits.

This follows the criteria schematically indicated in FIG. 5, taken in context with FIGS. 4 and 6, which precede and follow it.

Observing the configuration data (examined in conjunction with the previously supplied Table I), it will be noted that the part "b" still identifies the different modes with which the three sections must be processed, namely:

the "higher" section in compressed mode (mode 2 in Table I), the "middle" section in original mode (mode 3 in Table I), and the "lower" section in average mode (mode 1 in Table I).

In particular, here the "average" mode is identified with (by way of example) calculating the arithmetic average of the sum of the data (C1, C2, C3 and C4) within the same section.

The "compression" mode is identified with (always by way of example) checking the identical occurrence of the section ($A_1$) contained in the first data item in the corresponding sections ($A_2$, $A_3$ and $A_4$) contained in the remaining data sub-blocks.

The total number of data items under exam is identified by the "grouping" register.

A flag is therefore required to inform the decompressor of the type of result obtained. In general, this flag is equal to 1 in the case of success (Y) and 0 in other cases (N). By success, the identical occurrence of section A1 in all of the other sub-blocks is intended: namely, $A_1=A_2=A_3=A_4$.

The "original" mode generally indicates the direct transmission of data belonging to the same section without any modification.

Lastly, "fixed" mode indicates, only for the decompression phase, the assignment of a fixed value to all data belonging to the same section. The decompressor will therefore use the value stored in a specific register.

Figures 3, 4, 5, 6:
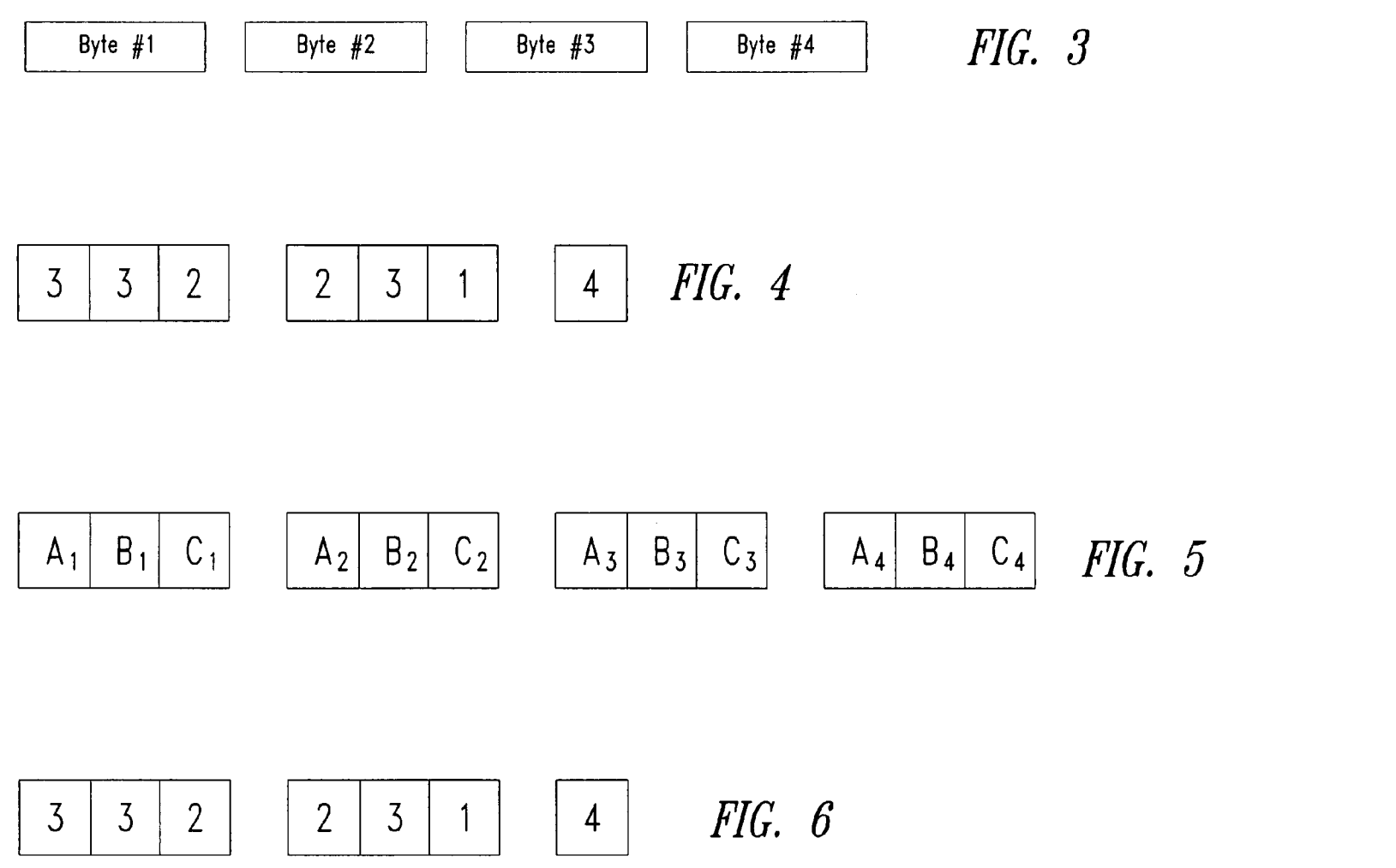

FIG. 6, in itself formally identical to FIGS. 1 and 4, in fact represents the data set identifying the configuration.

Figure 7:
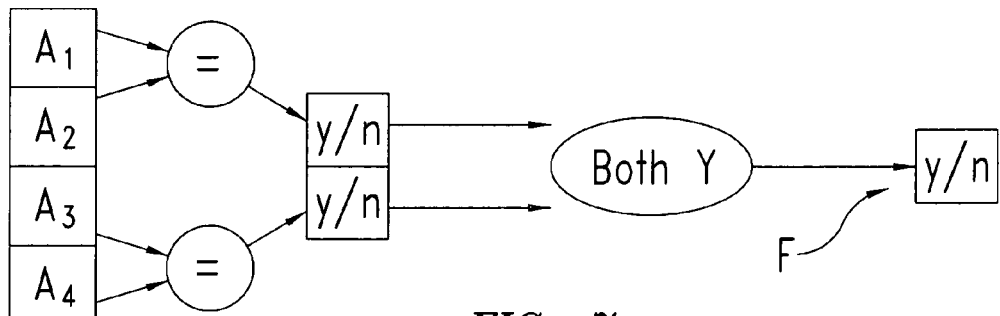

Instead, FIGS. 7, 8 and 9 graphically illustrate, using self-evident criteria, the actuation of the various, previously described operations, with the objective of computing the three sections denominated "higher" (FIG. 7—subjected to compression: Y or N, depending on the result), "middle" (FIG. 8 transmitted in original format) and "lower" (FIG. 9 subjected to averaging, where the T* values are the partial results and the C* value represents the calculated final arithmetic average).

The consequently achieved results are then subjected to the real compression phase, that is the aggregation operation that leads to the generation of the compressed "bit-stream" in output.

Essentially, this bit-stream or bit flow consists in the successive concatenation of the sections into which the input bytes were broken down and compressed. No method exists for the concatenation operation that could bring further benefits in reducing the quantity of transmitted data.

Therefore, proceeding with the example discussed up to now, it is possible to concatenate the higher, middle and lower sections in the same order in which they were created, or with a different order.

It is still possible to define a high-level compressed data structure, or rather divide the data into two clearly defined regions: a zone reserved for writing the control flags and a zone reserved for the data itself. These zones are schematically represented in FIG. 10, where they are indicated as CFS and CDS respectively.

The introduction of this layout, which will be illustrated further in the following, serves to accelerate the data reconstruction phase during execution of the decompression function.

It will be appreciated that the solution in accordance with the invention is in itself transparent with respect to the specific criteria or algorithms that are liable to be used, for example, for carrying out the compression function or the average of the various processed sections. In other words, the application of the invention is not in any way restricted by the fact that, for example, the compression operation is carried out exactly according to the methods represented in FIG. 7 or that the average operation is carried out according to the specific methods illustrated in FIG. 9.

Various possibilities that can occur during compression will be presented in the following; here, the difference is only likely to occur in the compression related section. This depends upon the configuration illustrated by way of example. In any case, it will be appreciated that the same principle, with the relative consequences, can also be applied to other methods suitable for being expressed via the configuration's "b" factor.

Concentrating, for the sake of simplicity, on the example of compression actuated according to the criteria represented in FIG. 7, it will be noted that in the case where at least a single occurrence exists that is different from the candidate key (the first in the list, $A_1$), that is when even just one of $A_2$, $A_3$ or $A_4$ is different from $A_1$, the relative flag is set to the negative value (N), which forces all of the data to be transmitted ($A_1$, $A_2$, $A_3$ and $A_4$).

The scheme shown in FIG. 11 represents the case where compression fails, with the first cell representing the flag N (N=no).

Instead, the scheme shown in FIG. 12 represents the case where compression is successful, with the first cell set to the positive value Y (Y=yes).

By comparing the two possibilities, the achievable amount of encoding gain can be observed. Clearly, for any given information set and source, this gain can vary significantly in relation to variations in the parameters and methods of analysis.

Figure 13:
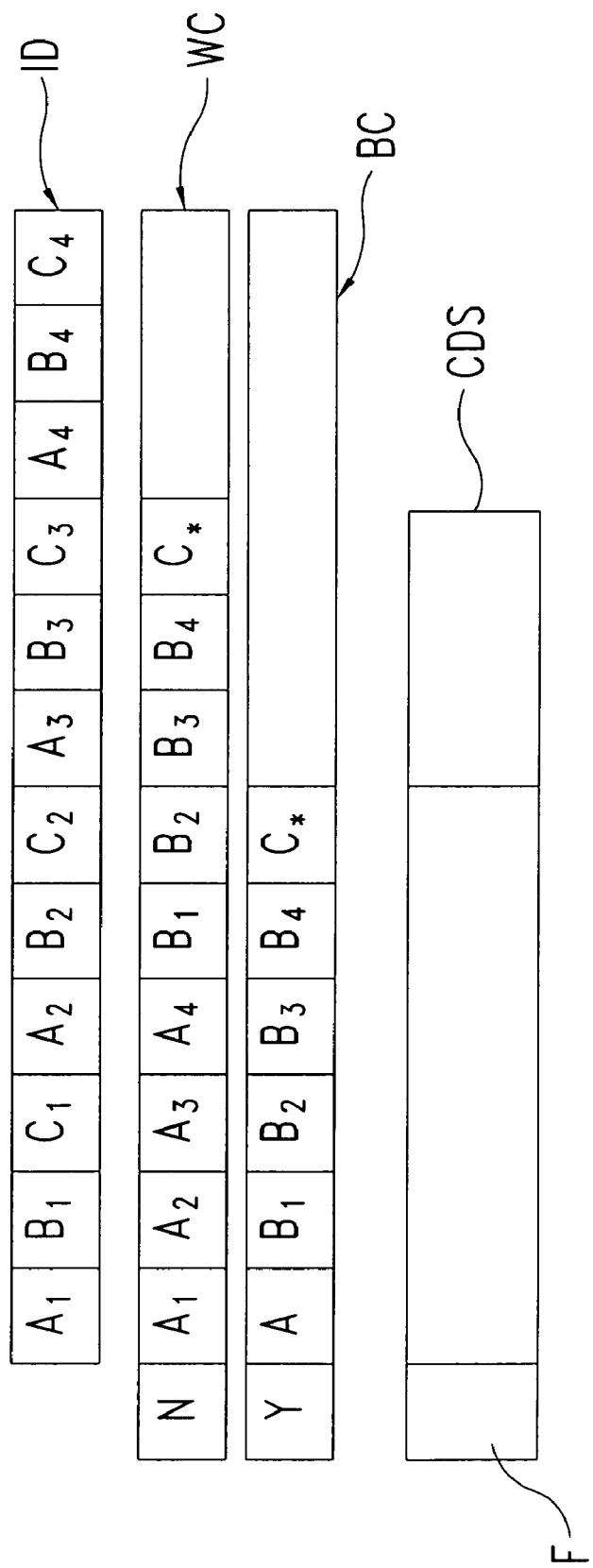

For example, the scheme shown in FIG. 13 compares the compression results achieved in the worst case WC and best case BC, for the same input data ID. All is with reference to the compressed data's general bit-stream structure.

Figure 14:
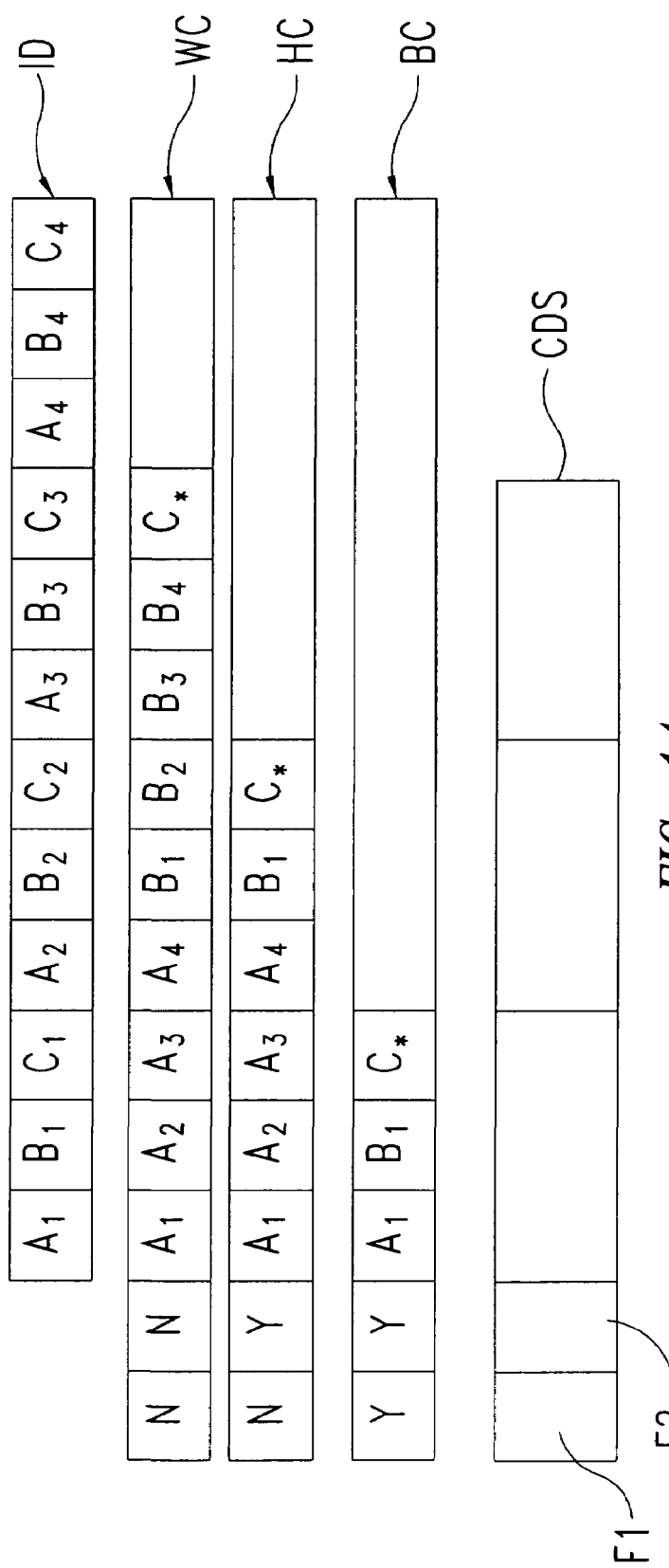

Using the same graphical representation, FIG. 14 shows that, hypothesizing the application of the compression mode for both sections A and B (in the previously illustrated examples, the respective modes were compression for section A and original for section B), it is possible to achieve a greater final compression ratio.

In particular, besides the worst case WC (compression unsuccessful in both cases) and the best case BC (compression successful in both cases), FIG. 14 also shows a halfway situation HC (first case unsuccessful and second case successful).

All with the necessary provision of two corresponding flags F1 and F2. It will be appreciated that the example given with reference to FIG. 14 corresponds to the configuration 3 3 2; 2 2 1; 4.

Figure 15:
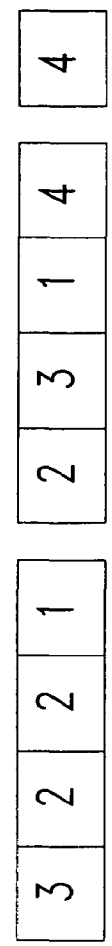

By radically changing the configuration according to the scheme shown in FIG. 15, it is possible to obtain other general compression factors.

For immediate reference, the configuration scheme represented in FIG. 15 (3 2 2 1; 2 3 1 4; 4) contemplates, as in the case of the previous examples, a configuration with four sub-blocks. These sub-blocks include four sections, of which:

the first is composed of three bits in compressed mode (mode 2 in Table I, listed at the beginning of this description), the second includes two bits in original mode (mode 3 in Table I), the third also includes two bits, in average mode (mode 3 in Table I), the fourth includes a single bit, evidently transmitted in fixed mode (mode 4 in Table I).

Figure 16:
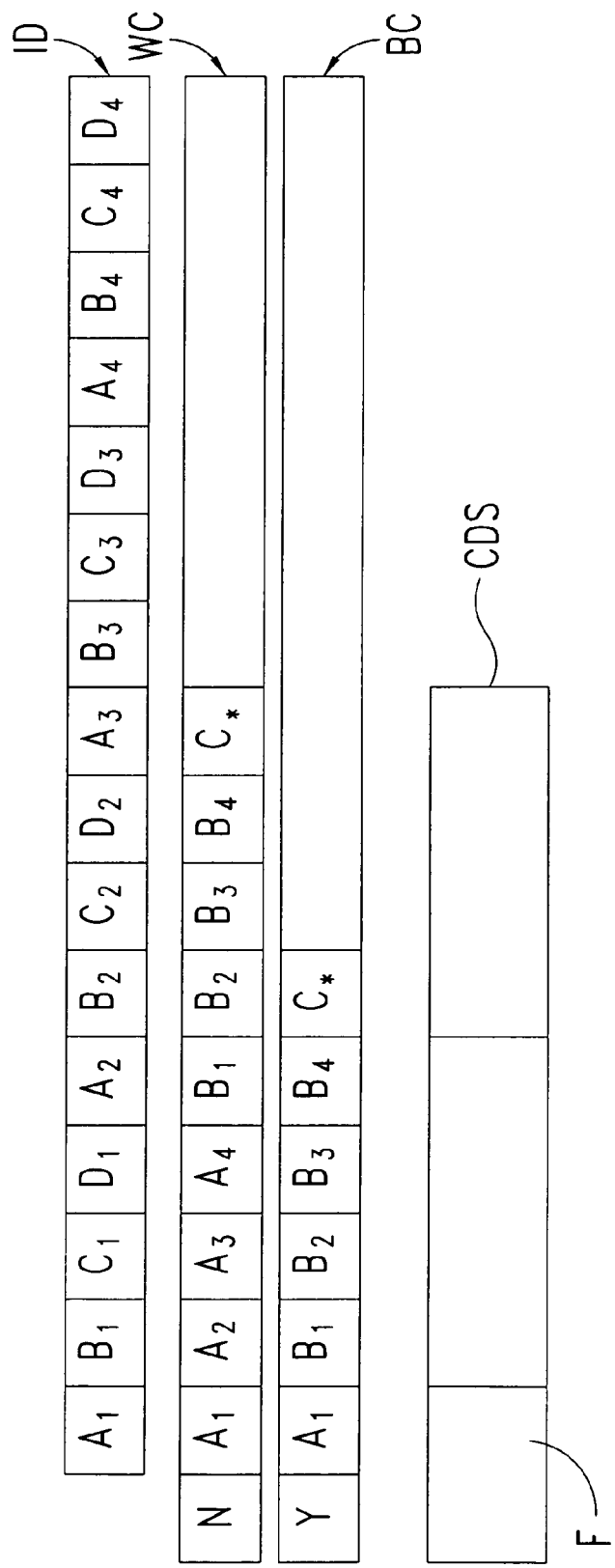

In the compressed bit-stream represented in FIG. 16 (whether in the worst case WC or best case BC, according to the outcome of the compression), due to the adoption of mode 4 (fixed) for the fourth section of the input data, the information relative to this fourth section is not present. This data item will in fact be reconstructed by the decompressor, possibly via the use of a specific programmable register.

The last phase of the compression process, outlined by block 14 in FIG. 2, is the transmission of the data structure in compressed format for storage on one or more mass memory media within the system.

Decompression

The moment in which a compression operation is actuated within the system according to the previously described criteria, it is necessary to provide a corresponding inverse function inside the same system for the cascaded phase of reading data from memory.

All of this occurs according to the generic modes illustrated in FIG. 17, This Figure illustrates how it is possible to pass from input data ID' (corresponding to the compressed data OD seen in FIG. 2) to output data OD', destined to virtually correspond to the input data ID of FIG. 2.

The term "virtually" is used here to take into account possible phenomena of information loss, as previously mentioned and which will be further discussed in the following.

In a substantially dual manner with respect to the sequence of operations represented in FIG. 2, the decompression process represented in FIG. 17 contemplates a sequence of operations including:
  an operation for extracting the flags 20,
  a decomposition operation 21,
  a reconstruction operation 22, and
  a transmission operation 23.

The fundamental difference between the compression and decompression processes consists in the fact that no special calculations need to be performed in the decompression phase, in the sense that the decompression engine must only read the data from memory, break down the relative data flow in the opportune mode and then correctly extract the information required for the exact reconstruction the original data.

The only information required by the decompression function is the "configuration" used in the compression function. This information is destined to reside inside a specific register for communications between the compressor and decompressor or, in the case where the configuration is modified on an image-by-image basis, inside a header of the compressed bit-stream.

Generally speaking, the access authorizations to the said register/header will be write-only for the compressor and read-only for the decompressor.

In any case, reference is always to the same initial configuration, that is with reference to the examples supplied in FIGS. 1 to 13, with an initial configuration of 3 3 2; 2 3 1; 4.

In phase 20 of flag extraction a compressed word is read and, in particular, the content of the section containing the compression flag (F or F1, F2, with reference to the example in FIG. 14).

Given the variable size of this word, the size will be equal to the worst case allowed by the compression configuration.

The value of the compression flag (Y or N) normally indicates success or failure of the compression analysis phase.

This information is used by the subsequent decompression phase, which basically acts on a data structure of the same type as those schematically represented in FIG. 18; please note the direct correspondence of this figure with the configurations represented in the previously observed FIGS. 11 and 12.

In fact, in the decompression phase 21, the value of the compression flag indicates the number of times that it is necessary to extract information associated with the flag from the compressed bit-stream.

In the case of success (flag value is Y), it is only necessary to extract one data item ($A_1$), destined to be replicated n times by the subsequent reconstruction phase.

In the case of failure (flag value is N), it is sufficient to simply extract the data ($A_1$, $A_2$, $A_3$, and $A_4$) from bit-stream; these data items are not subject to any further replication.

At the end, the last data item is extracted. This represents the arithmetic average of the original data. Clearly, this data item ($C^*$) is destined to be replicated in the subsequent reconstruction phase.

The results obtained from the decompression phase are represented in FIG. 19, from which the dual nature with respect to the representations shown in FIGS. 7, 8 and 9 may be appreciated.

In the reconstruction phase 22, the original data is reconstructed, correctly positioning the data items inside the base structure, which in the reference example is still the byte representing a pixel of the image in input.

More in detail, the information in section A1 is either replicated or not in relation to the content of the first part of FIG. 19. The same thing happens for the last section where the average ($C^*$) of the section C is contained.

When all required data replications have been performed, the four bytes must effectively be filled to arrive at the reconstruction result represented in FIG. 20.

This result corresponds to the reconstruction of all of the necessary information.

It should be noted that the average of section C and its subsequent replication might result in a degradation of the final quality of the digital information.

Special attention must therefore be given to this mode of compression configuration and also the amount of data destined to be averaged.

Concerning this, it may usefully be observed that one of the fundamental characteristics of the solution in accordance with the invention is that after the first compression and decompression operation, a new data structure is obtained, the final section of which (i.e., section C) always consists of the same value (block by block), and is destined to remain so for all other iterations that the digital information is subsequently subjected to.

In practice, this concept corresponds to a temporal invariance of the compression.

In such situations, and in the eventuality that this average is equal for the entire image, it may be convenient to modify the configuration to set the fixed mode (4) for this section and load the value $C^*$ in the specific communications register. This type of change can, in any case, be hypothesized where image preprocessing and analysis structures are situated upstream of the compression phase, or rather before the described process is applied.

Also in the case of the functional sequence in FIG. 19, the last operation is composed of the transmission phase 23, i.e., the effective transmission of the result of byte reconstruction to the system blocks dedicated to processing the relative data.

The scheme shown in FIG. 21 illustrates a possible configuration for a system operating in accordance with the invention.

Within the scope of this system, globally indicated as item 30, the block 40 essentially represents the compression module (breakdown, analysis, formatting and transmission) destined to operate on input signals arriving from a source 50 for transmission (in compressed form) to memory indicated as item 60

Communications between block 40 and memory 60 is effected via a communications bus 70. The latter also provides communications in the opposite direction, between memory 60 and one or more modules 80 destined to perform the previously described decompression function (flag extraction, decomposition, reconstruction and transmission) for feeding reconstructed data to one or more processing modules indicated as item 90.

Data generated by the relative processing functions can be sent out and/or sent back to the source 50 for possible combination with data originating from external sources on a line generically indicated as item 100.

The scheme represented in FIG. 21 must, in any case, be merely considered as an example of an architectural solution capable of implementing the solution in accordance with the invention.

In particular, this architectural solution is susceptible to implementation:
- at hardware level, in the form of a processor for example,
- at IP level (in the form of a VHDL description for example), utilizable for the design, simulation and emulation of such a processor,
- in the form of a general-purpose digital processor that, when suitably programmed, is suitable for actuating the described methods of operation, and
- in the form of a computer program product (resident on a fixed support, such as a disc, or suitable for downloading from a network) that, when loaded and run on a computer device of the described type, allows the latter to actuate the previously considered methods of operation.

Experiments carried out by the Applicant, especially in the field of image processing, have demonstrated the possibility of using the solution in accordance with the invention with profit on images of various sample formats (4:4:4, 4:2:2 and 4:2:0), quantifying the compression ratio and evaluating the resulting quality in various cases with different spatial correlation between the chrominance components.

With regard to the configurations, preference has been given to those configurations that break down each image byte into three separate sections, of which one is in compression mode, one in original mode and the last one in average mode.

The motives that result in preferring this type of selection derive from considering the fact that, since the greatest data variability is in the least significant part of the pixels, it is assumed that the probability of compression (in the compression function, obviously) of this section is relatively low—low enough to suggest using the original mode. Everything is inverted if the most significant part of each pixel of the image is considered and so here it is decided to apply the compression mode.

With regards to evaluating the loss of quality generated in the compression phase using the average mode, it is possible to farther subdivide the least significant section into two parts, with the upper part processed in original mode and the lower part in average mode.

Independently of the image content, the portion of the byte dedicated to this last section is usually limited to the last two or three bits. This is in order to limit the loss of final quality in cases where there is a high level of variability in this part.

Regarding the number of pixels suitable for simultaneous consideration in defining the basic entity of the compression and decompression processes, this number can be quantified on the basis of two elements: division and uniqueness.

That is to say, in the case of using the average mode, it would be desirable to use a number of data items H equal to a power of two, to render the calculation quicker and simpler. This allows the system to perform the division via a simple binary-shift operation and without the use of dedicated designs for this division operation. In addition, because of the redundancy introduced by the compression mode flag, this H value must be greater or equal to four. For this reason, the number of pixels utilized in the majority of the experiments carried out is 16.

With regards to uniqueness, the compression and decompression functions for information relative to luminance and chrominance can be based on the same process configuration.

Experiments carried out with different modes (2 2 4, 2 3 3, 2 4 2, 3 2 3, 3 3 2 and 4 2 2—although using the same mode, namely 2 3 1, for identifying the type of processing for unpacked data) demonstrates the opportunity of choosing a value of 16 for the number of pixels destined to be simultaneously processed.

This choice is found to be advantageous for simplifying the feature extraction phase, and also for three other factors, namely:
- taking the different types of chrominance information sub-sampling into account: 4:2:2 and 4:2:0,
- avoiding internal fragmentation of image blocks, and
- taking the correlation between pixels belonging to the same line into greater account.

In particular, 720 has been taken as the reference value for the number of pixels present on the same line. It may be noted from the results that the number of portions into which each line of an image is broken down varies according to the format of the image, but is independent of the number of pixels in each portion (16).

In the 4:2:2 and 4:2:0 formats, portions composed in part of the row under exam and part empty would be created: it should be remembered that between the end of a row and the start of the next one there are time intervals where no information is provided in input (line synchronization).

A possible solution thus consists of reducing the number of pixels in each portion of chrominance according to the format of the image. Doing so does not create any internal fragmentation and the number of portions into which each line of the image is broken down remains constant.

The scheme shown in FIG. 22 represent a number of pixels for line portions with respective reference to:
- a 4:4:4 format on 720 pixels for each line (FIG. 22a)
- a 4:2:2 format on 360 pixels (FIG. 22b), and
- a 4:2:0 format on 180 pixels (FIG. 22c).

Table II, shown below, illustrates the ratio between the number of pixels per line and the number of pixels per portion currently considered as recommendable. Again, the fact of defining the number of pixels per portion as 8 implies a breakdown into two pixels per portion for the 4:2:0 format. The compression ratio could therefore be annulled by the redundancy introduce by the compression mode flag.

TABLE II

| | PIXEL/PORTION RATIO | | | | | |
|---|---|---|---|---|---|---|
| | Y/64 | Y732 | Y/16 | Y/8 | Y/4 | Y/2 |
| 720/X | 11.25 | 22.5 | 45 | 90 | 180 | 360 |
| 360/X | 5.625 | 11.25 | 22.5 | 45 | 90 | 180 |
| 180/X | 2.8125 | 5.625 | 11.25 | 22.5 | 45 | 90 |

As has been stated, the previously described solution is potentially lossy, i.e., with possible loss of information.

From this, it can be deduced that the fields of application where the described type of compression and decompression can be applied are mainly those of video and/or audio signal processing where a limited loss of information quality is acceptable, on the understanding that this is not visible and/or audible.

Based on the characteristics of the digital information in question, it is possible to select some configurations and, in particular the modes, for which no processing is carried out that could affect the data content, as in the case of the average mode. In this way, the described solution becomes completely lossfree.

There are two possible ways of achieving this result:
the first is to know the type of data to be processed in advance and consequently adopt an offline processing strategy, and
the second is to position a system upstream of the compression phase that is capable of determining, online, the best configuration to apply.

With regards to video signal processing, the solution in accordance with the invention is particularly suited for use in applications such as:
teletext, videotext or viewdata, characterized by a limited color map,
background, where the loss of quality is masked by the foreground content, and
images with low frequency spectral content in general.

With regards to systems where the solution in accordance with the invention is likely to be used to greater advantage, it may be observed that the compression causes a reduction in the amount of data transmitted over the communications channels, effectively increasing the bandwidth and thus the size of the channels and, lastly, the useful end dimensions of the storage mechanisms.

The solution in accordance with the invention is therefore suited for utilization in all situations where cache memory is used, where it can prove particularly advantageous; here, increasing the number of data items that can be read and/or written increases the probability of a hit while reducing that of a miss. Alternatively, applications in sectors where memory occupation related restrictions exist can be considered; here, a minimal percentage reduction in memory requirements can be assured. Given the highly parallel nature of the compression and decompression processes, the solution in accordance with the invention can also be advantageous in real-time applications: these factors allow parallel execution of processes, whilst simultaneously guaranteeing reduced processing resource requirements.

Naturally, the principle of the invention being understood, the details of realization and the forms of implementation could be extensively changed with respect to that described and illustrated without leaving the scope of this invention, as defined in the annexed claims.

From the foregoing it will be appreciated that, although specific embodiments of the invention have been described herein for purposes of illustration, various modifications may be made without deviating from the spirit and scope of the invention. Accordingly, the invention is not limited except as by the appended claims.

We claim:

1. A data conversion process that includes a procedure for converting signals in the form of digital data between an original format, in which the digital data include plural data items and each data item includes a first number of digits, and a compressed format that includes plural compressed data items, in which each compressed data item includes a second number of digits that are less than the first number, the process comprising the operation of associating the data items of the digital data with a configuration including, for each data item of the digital data:
creating a first field identifying a number of sub-blocks into which the data item is subdivided;
creating a second field that identifies, within the sub-blocks, respective sections, each including a number of digits; and
creating a third field that identifies, for each of the sections, a respective one of a plurality of applicable modes that can be adopted for converting the digits in the section between the original format and the compressed format.

2. A process according to claim 1, wherein the digits are binary digits.

3. A process according to claim 1 wherein the plurality of modes includes conversion modes chosen from the group consisting of:
average of digits included in the section;
compression of digits included in the section;
identity between said original format and said compressed format of the digits in the section; and
assignment of a fixed value to all of the digits belonging to the section.

4. A process according to claim 3, wherein the third field indicates, for one of the sections, the mode of the assignment of a fixed value to all of the digits belonging to the one section, which indicates that the mode will only be adopted in a conversion of the compressed data items from the compressed format to the original format.

5. A process according to claim 3, wherein the adoption of the mode of compression, in the conversion between the original format and the compressed format, checks if the digits of the respective section appear with the identical value in all of the sub-blocks of the data item and the adoption, in the compressed format, of a single section for all of the sub-blocks with the identical value.

6. A process according to claim 5, further comprising generating a flag indicating successful compression when the check gives a positive result.

7. A process according to claim 5, further comprising, when the check gives a negative result, adopting an identity mode between the original format and the compressed format for the section.

8. A process according to claim 7, further comprising, when the check gives a negative result, generating a flag indicating compression failure.

9. A process according to claim 3, further comprising identifying in the compressed data, at least one flag indicating that the compressed mode has been successfully adopted for at least one instance of the sections and identically reproducing a matching section for all of the sub-blocks of the reproduced data item in the original format.

10. A process according to claim 9, further comprising ordering the data in compressed format into a data flow, inserting at least one flag in a certain position of the flow.

11. A process according to claim 3, wherein when the said average mode is adopted, the respective section is reproduced, in the compressed format, as the arithmetic average of the sum of the data inside the section in the original format.

12. A process according claim 3, further comprising associating with the data in compressed format a data string identifying the configuration.

13. A process according to claim 1, wherein the conversion from the said original format to the said compressed format includes:
 breakdown of the data into the sub-blocks;
 organization of the relative sections;
 analysis of the sections on the basis of the third field of the configuration, organizing each of the sections according to an instance of one of a plurality of modes, so as to generate, for the respective section, a respective data item in compressed format; and
 formatting the resulting compressed data into a compressed data flow.

14. A process according to claim 1, further comprising a converting from the said compressed format to the said original format by:
 recognizing, within the compressed data, information identifying the modes adopted for conversion into the compressed format in each of the sections;
 decompressing compressed data in the respective sections, generating at least one corresponding section in the original format for each section in the compressed format; and
 reconstructing the data in the original format, reorganizing the sections in the original format into the sub-blocks.

15. A process according to claim 14, wherein one of the modes is a compression mode that includes checking if the digits of the respective section appear with the identical value in all of the sub-blocks of the data item and adopting, in the compressed format, a single section for all of the sub-blocks with the identical value, wherein the decompressing step includes generating, for each sub-block, a respective section with a value corresponding to the identical value.

16. A system for processing signals in the form of digital data, comprising:
 a memory unit;
 a processing unit for processing the signals;
 an input unit suitable for being fed with the signals in the form of digital data;
 a compression module for receiving the signals in the form of digital data and converting them from an original format into a compressed format and feeding them to the said memory unit in said compressed format, wherein said compressed format includes a configuration having a first field identifying a number of sub-blocks into which the digital data in original format are subdivided; a second field that identifies, within the sub-blocks, respective sections, each including a given number of digits; and a third field that identifies, for each of the sections, a respective one of a plurality of applicable modes that can be adopted for converting the digits in the section between the original format and the compressed format; and
 a decompression module, suitable for receiving said data in the compressed format from the memory unit and converting the signals in compressed format into data in the original format, and then feeding the data in original format to the processing unit.

17. A system according to claim 16 wherein the processing unit generates output data that is returned to the input unit.

18. A computer program product directly load able into an internal memory of a digital computer, comprising software code portions for performing the following steps when said product is run on a computer:
 creating a first field identifying a number of sub-blocks into which a data item is subdivided;
 creating a second field that identifies, within the sub-blocks, respective sections, each including a given number of digits; and
 creating a third field that identifies, for each of the sections, a respective one of a plurality of applicable modes that can be adopted for converting the digits in the section between the original format and the compressed format.

19. The computer program product of claim 18, further comprising further software code portions for performing the following when said product is run on a computer:
 using the first, second, and third fields to decompress the digits in the compressed format into the original format.

20. The computer program product of claim 18, further comprising further software code portions for performing the following when said product is run on a computer:
 providing a flag indicating whether one of the sections was successfully compressed.

21. A process for converting digital input data having plural input data items to digital output data having plural output data items corresponding respectively to the input data items, the process comprising:
 for each input data item, dividing the input data item into plural input sub-blocks including first and second input sub-blocks and dividing each of the input sub-blocks into plural input sections of digits including first and second input sections;
 converting the first input sections of the first and second input sub-blocks into a first output section code according to a first conversion mode; and
 converting the second input sections of the first and second input sub-blocks into a second output section code according to a second conversion mode.

22. The process of claim 21, further comprising, for each of the input data items, creating a configuration that identifies how the input data item is converted into the corresponding output data item.

23. The process of claim 22 wherein the step of creating a configuration for each of the input data items includes:
 creating a first field identifying the number of input sub-blocks into which the input data item is subdivided;
 creating a second field that identifies how many digits are included in each of the respective input sections of the input sub-blocks of the input data item; and
 creating a third field that identifies, for each of the input sections of the input data item, a respective one of a plurality of applicable conversion modes that was used to convert the input section into an output section code.

24. The process of claim 21 wherein the first conversion mode is a data compression mode in which the first output section code includes fewer digits than the first input sections and the second conversion mode is an identity mode in which the second output section code is identical to the first input sections.

25. The process of claim 21 in which the input data items are converted in parallel to respective output data items independently of each other.

26. A process for converting digital input data having plural input data items to digital output data having plural output data items corresponding respectively to the input data items, each input data item being in a compressed format compared to the corresponding output data item and including first and second input section codes, the process comprising, for each input data item:
- converting the first input section code of the input data item into a plurality of first output sections of digits according to a first conversion mode, the first output sections including first and second first output sections;
- converting the second input section code of the input data item into a plurality of second output sections of digits according to a second conversion mode, the second output sections including first and second second output sections; and
- arranging the output sections into sub-blocks of the output data item corresponding to the input data item by arranging the first first output section immediately adjacent to the first second output section in a first one of the sub-blocks and arranging the first second output section immediately adjacent to the second second output section in a second one of the sub-blocks.

27. The process of claim 26 wherein the first conversion mode is an identity mode in which the first output sections, taken together, are identical to the first input section code.

28. The process of claim 26 wherein the first conversion mode is a decompression mode in which the first input section code is decompressed to obtain the first output sections, which taken together, include more digits than the first input section code.

29. The process of claim 28 wherein the decompression mode includes copying the first input section code such that the each of the first output sections is identical to the first input section code.

* * * * *